United States Patent [19]

White et al.

[11] Patent Number: 4,810,617

[45] Date of Patent: Mar. 7, 1989

[54] TREATMENT OF PLANARIZING LAYER IN MULTILAYER ELECTRON BEAM RESIST

[75] Inventors: Lawrence K. White, W. Windsor Township, Mercer County; Richard Brown, Union County, both of N.J.

[73] Assignee: General Electric Company, Schenectady, N.Y.

[21] Appl. No.: 48,857

[22] Filed: May 12, 1987

Related U.S. Application Data

[62] Division of Ser. No. 802,020, Nov. 25, 1985, Pat. No. 4,702,993.

[51] Int. Cl.$^4$ ............................................. G03C 1/76
[52] U.S. Cl. .................................... 430/272; 430/296; 430/271; 430/942; 428/473.5; 428/446; 428/451
[58] Field of Search ............... 430/296, 272, 271, 942; 428/473.5, 446, 451

[56] References Cited

U.S. PATENT DOCUMENTS

| | | | |
|---|---|---|---|
| 3,893,127 | 7/1975 | Kaplan et al. | 430/296 |
| 4,065,307 | 12/1977 | Goffe | 430/272 X |
| 4,068,018 | 1/1978 | Hashimoto et al. | 430/5 |
| 4,396,702 | 8/1983 | Desai et al. | 430/296 |
| 4,456,677 | 6/1984 | Chin | 430/276 |
| 4,511,445 | 4/1985 | Forrest et al. | 428/411.1 |

FOREIGN PATENT DOCUMENTS

| | | | |
|---|---|---|---|
| 0116745 | 7/1984 | Japan | 430/296 |
| 0053023 | 3/1985 | Japan | 430/296 |
| 0074521 | 4/1985 | Japan | 430/296 |

OTHER PUBLICATIONS

E. C. Fredericks, "Adhesion and Release Layer for Resist Structures", *IBM Technical Disclosure Bulletin*, vol. 20, No. 3, Aug. 1977, p. 992.

E. Ong and E. L. Hu, "Multilayer Resists for Fine Line Optical Lithography", *Solid State Technology*, Jun. 1984, pp. 155–160.

J. B. Kruger, P. Rissman and M. S. Chang, *Journal of Vacuum Science Technology*, vol. 19, No. 4, Nov., Dec., 1981, pp. 1320–1324.

*Primary Examiner*—Paul R. Michl
*Assistant Examiner*—Hamilton, Cynthia
*Attorney, Agent, or Firm*—Henry I. Steckler; James C. Davis, Jr.; Paul R. Webb, II

[57] ABSTRACT

An improved electron beam resist structure comprises an organic planarizing layer which has been treated with an ion beam for a time sufficient to render it conductive and an electron beam resist layer thereover. The electron beam resist layer is preferably oxygen plasma resistant. When the resist layer is not resistant to oxygen plasma and it is desired to develop the planarizing layer by oxygen plasma, the structure additionally includes a thin hard mask layer, suitably of silicon dioxide, interposed between the conductive planarizing layer and the resist layer.

5 Claims, No Drawings

TREATMENT OF PLANARIZING LAYER IN MULTILAYER ELECTRON BEAM RESIST

This is a division, of application Ser. No. 802,020, filed 11/25/85, now U.S. Pat. No. 4,702,993.

This invention relates to the formation of a patterned structure on a substrate useful for electron beam lithographic processing thereof.

BACKGROUND OF THE INVENTION

The use of electron beam irradiation to form a patterned resist structure on a substrate is known. The use of such resist structures for the further processing of the substrate, e.g. selective etching, metal deposition and the like, is likewise known. The increasing demand for very-large-scale-integrated (VLSI) devices has made imperative the formation of such structures having patterns on the order of one micrometer and below with accuracy and reproducibility.

The capability of electron beam generating equipment to produce an exceptionally narrow beam, e.g. 0.5 micrometer and below, is a significant advantage for fine-line lithography. It is recognized, however, that electron beam irradiation will backscatter from the substrate surface in much the same manner as light utilized to irradiate a photoresist will reflect from the substrate with a resultant loss of pattern resolution.

A second problem inherent in electron beam lithography is the build-up of a charge in the resist layer and on the substrate surface during irradiation. The deposited charge can cause aiming errors and pattern misalignment, both in orientation on the substrate surface and in the actual writing of the pattern.

The backscattering of an electron beam, commonly referred to as the proximity effect, has been addressed, for example, by varying the local irradiation, i.e. the scan rate and the dwell time, of the beam. While this is a reasonable approach for low-powered apparatus, variance of local irradiation is, at best, limited as the capacity of such apparatus approaches 300 MHz.

An approach to solving the problem of charge build-up is the deposition of a thin conductive coating on the substrate, or on the resist itself, as described in U.S. Pat. No. 3,893,127, issued July 1, 1975. This film, which is preferably 10–100 nm thick, is of a conductive metal, e.g. copper, aluminum, nickel and the like, or a layer of glass with a thin coating of a conductive oxide such as tin oxide or indium oxide. The use of such coatings is disadvantageous in that they require extra process steps for their patterning and subsequent removal.

U.S. Pat. No. 4,456,677, issued June 26, 1984, discloses a composite resist structure wherein a high atomic number film, e.g. gold, overlies a low atomic number film, e.g. aluminum, which in turn overlies a layer of positive resist. The thickness of the two films is selected so that only a small percentage of the electrons striking the top layer actually passes into the resist film. It is also stated that a single layer of resist impregnated with a high atomic number material could be utilized. In either instance, the high atomic number material will absorb a substantial portion of the electron energy, thus requiring the use of a highly sensitive resist material.

Another proposed electron beam resist medium is a trilayer structure comprising a base or planarizing layer and an electron beam resist layer separated by a thin layer, e.g. 60–100 nm thick, of silicon. In such a structure, the bottom layer must be sufficiently thick to prevent proximity effect and the silicon layer sufficiently thin so that it does not cause backscattering of the electron beam, yet sufficiently thick to dissipate charge build-up. It will be appreciated that, in addition to the extra process steps required for a three layer structure, both of the structures described above require that at least one of the layers meet very exacting criteria for thickness and uniformity.

A simplified resist structure for electron beam lithography is provided in accordance with this invention.

SUMMARY OF THE INVENTION

An electron beam resist structure is formed by spin-coating a substrate with a layer of a suitable polymer, treating the polymer layer with an ion beam to render it conductive and depositing a layer of a suitable electron beam resist thereover.

DETAILED DESCRIPTION OF THE INVENTION

The substrate upon which a patterned electron beam resist structure is formed in accordance with this invention may be any suitable material, for example, single crystalline silicon, gallium arsenide, tungsten, polycrystalline materials with suitable surfaces, vitreous materials or the like. The substrate may be appropriately doped to provide regions of varying conductivity. Topographical features on the substrate, if present, typically are devices, device subassemblies, silicon islands, mesas, circuit components and the like, and may be of the same or a material different from that of the substrate. The exact nature of such features is not critical to the invention.

A layer of a suitable organic polymeric material is initially deposited over the substrate. This layer will be referred to herein as a planarizing layer even if it is applied over a substrate having no topographical features. The polymer material, in general, must adhere well to the substrate, be suitable for the ion beam treatment described hereinafter, be otherwise inert and, ideally, have good planarizing capability. Particularly suitable materials include certain polyimides, and certain positive photoresists such as the novolac resin/diazoquinone sensitizer compositions. Our experience has shown that some organic planarizing materials, for example, poly(methylmethacrylate) are significantly eroded during the ion beam treatment contemplated herein. Such materials are not useful in the present process. The organic planarizing layer is suitably deposited onto the substrate by spin-coating and then cured by heating to the appropriate temperature. Polyimide layers, for example, are heated to from about 350°–400° C., suitably in an inert atmosphere, for from about 20 to 60 minutes.

The thickness of the planarizing layer must be sufficient to prevent electrons backscattering from the substrate from reaching the resist layer. In the event that the substrate has topographical features, the thickness of the planarizing layer is suitably from about 1 to 3 times the height of the highest such feature. Preferably, the thickness of the planariing layer is at least equal to the height of the highest topographical feature on the substrate. In general, the thickness of the planarizing layer is at least one micrometer, and suitably between about one and three micrometers. The minimum thickness of the planarizing layer will depend, in part, on factors such as the thickness and composition of the resist layer, the contemplated intensity and energy of the electron beam irradiation and the like.

In accordance with this invention, the planarizing layer is ion beam treated for a time sufficient to render it conductive. Although the exact mechanism responsible for the conductivity is not known with certainty, it is believed that the ion beam "graphitizes" or "carbonizes" the surface. The ion beam may also be severing bonds in the polymer lattice thereby creating free electrons. The ion beam treatment may be carried out with ions generally recognized as being electrically inert, such as argon, helium or nitrogen, or with electrically active ions such as arsenic, phosphorus or boron. Inert ions are particularly suitable in that they produce a minimum of side reactions. The parameters of the treatment will depend on the ion being utilized. Argon, for example, will produce a conductive surface on a polyimide layer at a plate bias of 500 V, $1 \times 10^{-5}$ torr and a beam current of 3 ma/cm$^2$. The ion treatment is carried out using conventional apparatus and conditions.

The ion beam treatment of the planarizing layer significantly increases the conductivity thereof. For example, an untreated layer of a conventional polyimide planarizing layer 2 micrometers thick has a resistance in excess of about 100 milliohms. Ion beam treatment of the layer with argon ions for 5 minutes as described above reduced the resistance, i.e. increased conductivity, to about one milliohm. This level of conductivity is more than sufficient to dissipate the charge build-up in conventional electron beam pattern irradiation. In general, the resistivity of the conductive planarizing layer after ion beam treatment should be at least about 10 milliohms.

The conductive ion beam treated planarization layer is coated with an electron beam resist. Particularly suitable electron beam resists are those which are resistant to oxygen plasma. Typical of such resists are poly(silane sulfone) copolymers disclosed in U.S. Pat. No. 4,357,369, issued Nov. 2, 1982 and represented by the formula

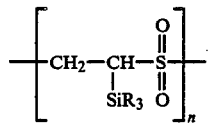

wherein R at each occurance is an alkyl group, suitably lower alkyl group, and n is an integer. Such copolymers suitably have a molecular weight of from about 50,000 to about 200,000 or above. Other conventional electron beam resists may be utilized as well. These include, for example, poly(1-butene sulfone) and COP, a copolymer of ethylacrylate and glycidyl methacrylate, both available from Mead Chemical Co.

The resist layer is applied to the planarizing layer, suitably by spin-coating, and dried to form a layer foom about 0.25 to 1.0 micrometer thick. The resist layer is suitably soft-baked at the recommended temperature to remove residual solvent.

In the event that the electron beam resist utilized to coat the planarizing layer does not have resistance to an oxygen plasma etch, it can be made resistant by treatment with, e.g., titanium tetrachloride or hexamethylene disilazane. It is also within the scope of this invention to utilize a thin hard-mask layer of a nonconductive material which would give minimal backscattering, preferably silicon dioxide. A suitable layer of silicon dioxide would be deposited over the planarizing layer by a conventional technique, such as evaporation, suitably to a thickness of from about 20 to 200 nanometers. Neither the application of a hard-mask layer, when present, nor application of the resist layer causes any significant loss in the conductivity of the planarizing layer.

The resist layer is pattern irraiiated with an electron beam or a modulated electron beam, and developed with a suitable developer. Silicon-containing oxygen etch-resistant resist compositions such as those in the above-mentioned patent are developed with an organic developer such as, for example, alcohols such as 2-methoxyethanol, isopropanol, ethoxyethanol and the like. These alcohols may be utilized individually, in combination, or in combination with a ketone developer such as, for example, acetone, ethylacetoacetate, tetrahydrofuran and the like.

The exposed portion of an intermediate hardmask layer, if present, is removed by conventional wet or dry etching. Silicon dioxide, for example, is suitably wet etched with buffered hydrofluoric acid, or dry etched in a fluorocarbon plasma. Since the hardmask layer is very thin, it is generally possible to achieve an anisotropic etch by careful control of the etch conditions.

The exposed portion of the conductive planarizing layer is then removed, suitably in an oxygen plasma. The ion beam treatment of the planarizing layer has no effect on its development. It is also possible to wet develop the planarizing layer, if the developer has substantially no effect on the resist layer. For fine-line electron beam lithography, however, dry development is preferred.

The resist structure provided in accordance with this invention is advantageous in that it has substantially reduced proximity effect from electron beam irradiation. It also effectively dissipates charge buildup by electron beam irradiation without the use of a metallic layer which might enhance the proximity effect of the irradiation. The subject resist structures additionally provide electron beam pattern delineation at the one micrometer level and below with relative ease of processing, particularly in comparison to systems having multiple layers of metal.

The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

The substrates for this example were three inch silicon wafers having epitaxial silicon islands 120 micrometers square and 0.5 micrometer in height. Dupont PI2555, a polyimide preparation, was spin-coated onto three substrates and cured at 400° under a nitrogen ambient for 30 minutes to form a polyimide layer 2.0 micrometers thick.

Utilizing an ion beam bombardment system, the polyimide layer on each wafer was treated for 2 minutes at ambient temperature with argon ions at a 3 milliamp/cm$^2$ current density and a plate voltage of 500 V. The electrical resistance of the surface of each wafer was about one milliohm.

HPR-204, Hunt Chemical Company, a commercial photoresist having e-beam sensitivity was spin-coated onto the wafers to a thickness of 1.0 micrometer. The films were allowed to dry and then baked at 95° for thirty minutes to remove residual solvent.

The wafers were irradiated in a scanning electron beam microscope which produced a beam approximately 0.5 micrometer in diameter. A pattern of lines and spaces 1.0, 1.5, 2.0 and 2.5 micrometers in width was formed on the resist layer of each wafer.

The pattern was developed with the developer recommended by the manufacturer in each instance. The resist layer showed excellent pattern delineation with no apparent erosion. There was no loss of resolution from proximity effects or charge buildup.

We claim:

1. A multilayer electron beam resist structure overlying a substrate, said structure comprising an ion beam treated layer of organic conductive planerizing material and a layer of electron beam resist overlying the planarizing layer, wherein said planarizing material is selected from the group consisting of a diazoquinone sensitized novolac resin and a polyimide resin.

2. A multilayer electron beam resist structure in accordance with claim 1, wherein the planarizing material is a polyimide resin.

3. A multilayer electron beam resist structure in accordance with claim 1, wherein the resist is resistant to oxygen plasma etching.

4. A multilayer electron beam resist structure in accordance with claim 3, wherein the resist is a poly(silane sulfone) copolymer represented by the formula

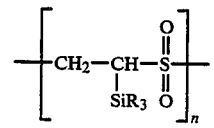

wherein R at each occurance is an alkyl group and n is an integer.

5. A multilayer electron beam resist structure in accordance with claim 1, wherein the said structure additionally contains a thin hardmask layer of silicon dioxide interposed between the conductive planarizing layer and the resist layer.

* * * * *